United States Patent
Nelson, Sr. et al.

(10) Patent No.: US 10,770,261 B2
(45) Date of Patent: Sep. 8, 2020

(54) SYSTEM AND METHOD TO MONITOR GLITCH ENERGY

(71) Applicant: Varian Semiconductor Equipment Associates, Inc., Gloucester, MA (US)

(72) Inventors: Larry G. Nelson, Sr., Webster, MA (US); Klaus Petry, Merrimac, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 78 days.

(21) Appl. No.: 15/842,544

(22) Filed: Dec. 14, 2017

(65) Prior Publication Data
US 2019/0189390 A1 Jun. 20, 2019

(51) Int. Cl.
| | |
|---|---|
| *H01J 37/24* | (2006.01) |
| *H01J 37/248* | (2006.01) |
| *G21K 5/04* | (2006.01) |
| *G01R 19/165* | (2006.01) |
| *G01R 31/12* | (2020.01) |
| *G01R 19/17* | (2006.01) |

(52) U.S. Cl.
CPC .............. *H01J 37/241* (2013.01); *G21K 5/04* (2013.01); *H01J 37/243* (2013.01); *H01J 37/248* (2013.01); *G01R 19/16576* (2013.01); *G01R 19/17* (2013.01); *G01R 31/1227* (2013.01); *H01J 2237/0206* (2013.01)

(58) Field of Classification Search
None
See application file for complete search history.

(56) References Cited

U.S. PATENT DOCUMENTS

| | | | | |
|---|---|---|---|---|
| 5,949,399 A | * | 9/1999 | Kreft | G01R 13/02 345/440 |
| 9,018,959 B2 | * | 4/2015 | Kawamura | G01R 31/50 324/509 |
| 2003/0197132 A1 | * | 10/2003 | Keum | H01J 37/3045 250/492.21 |
| 2004/0002202 A1 | | 1/2004 | Horsky et al. | |
| 2007/0200027 A1 | | 8/2007 | Johnson | |
| 2007/0221872 A1 | | 9/2007 | Olson et al. | |
| 2008/0067433 A1 | * | 3/2008 | Weiguo | H01J 37/026 250/492.21 |
| 2012/0003760 A1 | | 1/2012 | Lubicki et al. | |

(Continued)

FOREIGN PATENT DOCUMENTS

| | | |
|---|---|---|
| WO | 2007/111822 A2 | 10/2007 |
| WO | 2015/054494 A1 | 4/2015 |

OTHER PUBLICATIONS

International Search Report and Written Opinion dated Mar. 12, 2019 in corresponding PCT application No. PCT/US2018/057332.

*Primary Examiner* — James Choi
(74) *Attorney, Agent, or Firm* — Nields, Lemack & Frame, LLC

(57) ABSTRACT

A system and method for monitoring glitch frequency and energy is disclosed. The system includes a glitch capture module that monitors the voltage of a biased component and captures any glitches that occur. The glitch capture module also extends the duration of that glitch so that the controller is guaranteed to observe this glitch. In certain embodiments, the glitch capture module captures the maximum energy of the glitch by storing the minimum voltage, in terms of magnitude, of the glitch.

18 Claims, 5 Drawing Sheets

(56) References Cited

U.S. PATENT DOCUMENTS

2012/0262183 A1* 10/2012 Kawamura .......... G01R 31/025
324/509
2014/0021373 A1* 1/2014 Lubicki ................ H01J 37/026
250/492.3
2014/0152189 A1   6/2014 Gilmore
2015/0130353 A1   5/2015 Lin et al.
2016/0365225 A1* 12/2016 Anglin .............. H01J 37/32862

* cited by examiner

SYSTEM AND METHOD TO MONITOR GLITCH ENERGY

FIELD

Embodiments of the present disclosure relate to systems and methods for monitoring glitching energy, and more particularly glitch energy in an ion implantation system.

BACKGROUND

The fabrication of a semiconductor device involves a plurality of discrete and complex processes. One such process may be an etch process, where material is removed from the workpiece. Another process may be a deposition process, wherein material is deposited on the workpiece. Yet another process may be an ion implantation process where ions are implanted into the workpiece.

To direct the ions along the desired path, a system with electrical biased components, such as electrodes, is used. Some of these electrodes are maintained at relatively high voltages. These electrodes may be disposed proximate to other components which may be at a very different voltage. This difference in voltage between nearby components may cause arcing or a glitch in the power supply to occur. These glitches may lead to defects or degraded performance in the workpieces being processed.

Determining the frequency of these glitches and the energy of these glitches may be useful in determining when the system is due for preventative maintenance. However, many of these glitches are very short in duration and therefore may not be observed by a controller that only samples these voltages at a fixed sampling rate.

Therefore, it would be beneficial if there was a system and method for detecting and monitoring glitch energy and frequency. Further, it would be advantageous if the system allowed a controller, which samples these voltages at a predetermined sampling rate, to observe each glitch, even those that occur outside of the sampling window. It would also be beneficial if the controller was able to determine the energy of the glitch by observing the minimum voltage that occurs during the glitch.

SUMMARY

A system and method for monitoring glitch frequency and energy is disclosed. The system includes a glitch capture module that monitors the voltage of a biased component and captures any glitches that occur. The glitch capture module also extends the duration of that glitch so that the controller is guaranteed to observe this glitch. In certain embodiments, the glitch capture module captures the maximum energy of the glitch by storing the minimum voltage, in terms of magnitude, of the glitch. In certain embodiments, the glitch capture module is integrated into the power supply or the controller. In other embodiments, the glitch capture module is a separate component in the system.

According to one embodiment, an apparatus for processing a workpiece is disclosed. The apparatus comprises an ion source; an electrically biased component; a controller; and a glitch capture module, wherein the glitch capture module is in communication with the electrically biased component and the controller, and wherein the glitch capture module monitors a voltage present on the electrically biased component, captures and holds a lowest voltage detected on the electrically biased component, and transmits the lowest voltage to the controller. In certain embodiments, the controller samples the lowest voltage at a sampling rate, and the glitch capture module maintains the lowest voltage for a duration sufficiently long to insure that the lowest voltage is sampled by the controller. In certain embodiments, the electrically biased component comprises a component in an extraction optics. In some embodiments, the apparatus further comprises beamline components. In some embodiments, the electrically biased component may be a component in the extraction optics, in an acceleration/deceleration stage, or in an energy purity module.

According to another embodiment, an apparatus for monitoring glitches is disclosed. The apparatus comprises an electrically biased component; a controller; a sample/hold circuit having an input representative of a voltage present on the electrically biased component and an output; control logic; and a selector having an output in communication with the controller and an input in communication with the output of the sample/hold circuit, wherein the sample/hold circuit monitors a voltage present on the electrically biased component, the control logic determines a glitch has occurred, and the selector transmits a lowest voltage detected to the controller. In some further embodiments, the selector selects between the output of the sample/hold circuit and the input to the sample/hold circuit. In some further embodiments, the control logic compares the output of the sample/hold circuit and the input to the sample/hold circuit, and determines the output of the selector based on a result of the comparison. In some embodiments, when the output of the sample/hold circuit is selected, the control logic waits a predetermined time duration before resetting the sample/hold circuit and selecting the input to the sample/hold circuit. In some embodiments, the apparatus further comprises a high voltage readback path, comprising a circuit to convert the voltage present on the electrically biased component to a smaller positive voltage, wherein the input to the sample/hold circuit is an output of the high voltage readback path.

According to another embodiment, an apparatus for processing workpieces is disclosed. The apparatus comprises an ion source; extraction optics; an acceleration/deceleration stage; a glitch capture module in communication with a component in the extraction optics or the acceleration/deceleration stage; and a controller; wherein the controller receives a signal from the glitch capture module indicative of energy associated with a glitch. In some embodiments, the glitch capture module comprises a sample/hold circuit having an input representative of the voltage present on the component, and an output; control logic; and a selector having an output in communication with the controller and an input in communication with the output of the sample/hold circuit, wherein the sample/hold circuit monitors a voltage present on the component, the control logic determines a glitch has occurred, and the selector transmits the signal to the controller. In some embodiments, the controller determines whether a preventative maintenance process is to be performed based on the signal. In certain embodiments, the controller stores a trace that shows a voltage of the component as a function of time. In some embodiments, the trace may be a table that includes time and voltage.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
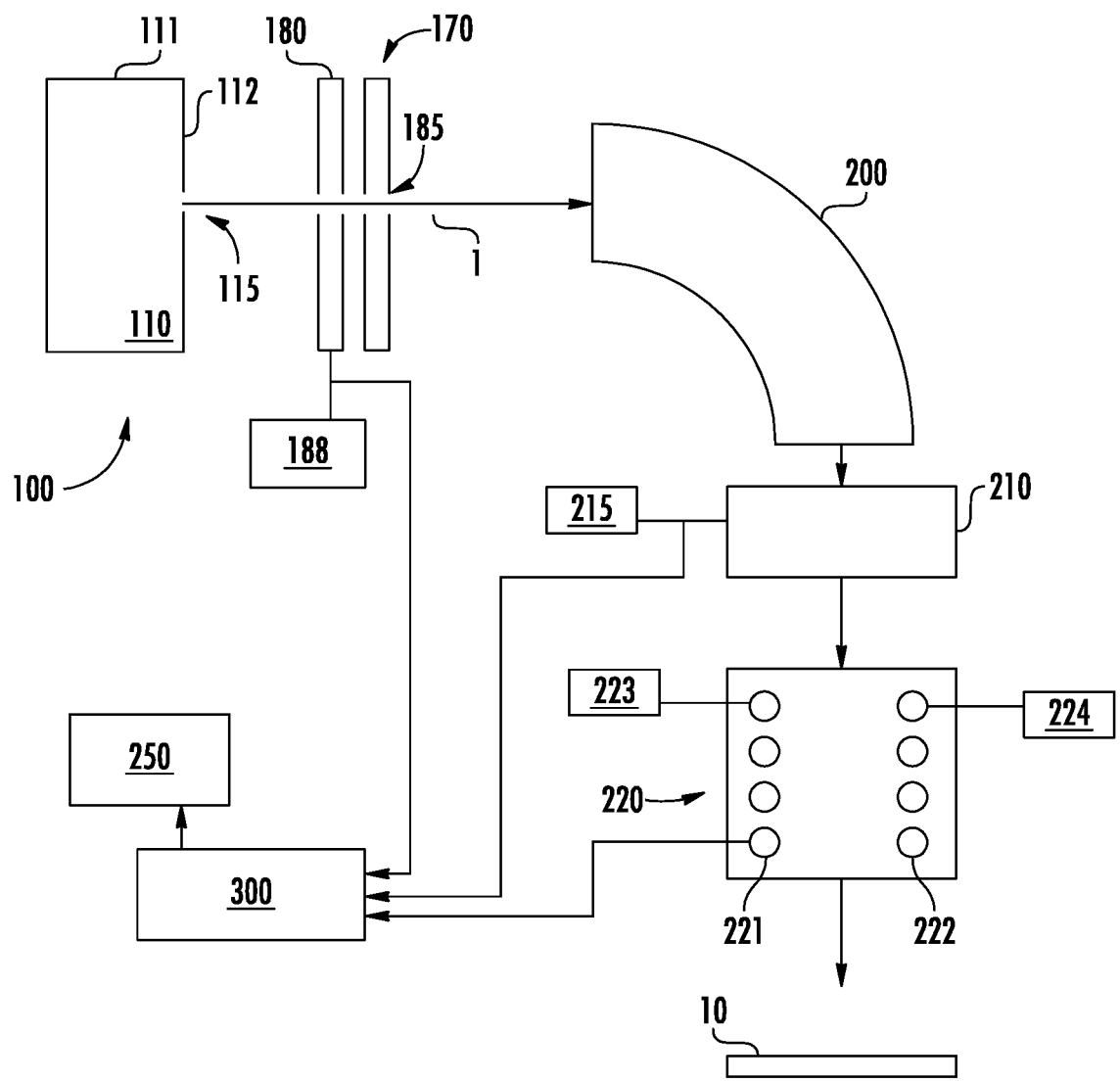
FIG. 1 is a representative view of the system for monitoring glitches according to one embodiment.

FIG. 1 shows a first embodiment of an apparatus that may be used with the glitch monitoring system described in this disclosure. The apparatus for processing a workpiece includes an ion source 100 comprising a plurality of chamber walls 111 defining an ion source chamber 110. In certain embodiments, the ion source 100 may be an RF ion source. In this embodiment, an RF antenna may be disposed against a dielectric window. This dielectric window may comprise part or all of one of the chamber walls 111. The RF antenna may comprise an electrically conductive material, such as copper. An RF power supply is in electrical communication with the RF antenna. The RF power supply may supply an RF voltage to the RF antenna. The power supplied by the RF power supply may be between 0.1 and 10 kW and may be any suitable frequency, such as between 1 and 15 MHz. Further, the power supplied by the RF power supply may be pulsed.

In another embodiment, a cathode is disposed within the ion source chamber 110. A filament is disposed behind the cathode and energized so as to emit electrons. These electrons are attracted to the cathode, which in turn emits electrons into the ion source chamber 110. This cathode may be referred to as an indirectly heated cathode (IHC), since the cathode is heated indirectly by the electrons emitted from the filament.

Other embodiments are also possible. For example, the plasma may be generated in a different manner, such as by a Bernas ion source or a capacitively coupled plasma (CCP) source. The manner in which the plasma is generated is not limited by this disclosure.

One chamber wall, referred to as the extraction plate 112, includes an extraction aperture 115. The extraction aperture 115 may be an opening through which the ions generated in the ion source chamber 110 are extracted and directed toward a workpiece 10. The extraction aperture 115 may be any suitable shape. In certain embodiments, the extraction aperture 115 may be oval or rectangular shaped, having one dimension, referred to as the length, which may be much larger than the second dimension, referred to as the height.

In certain embodiments, all of the chamber walls 111 and the extraction plate 112 are electrically conductive. In other embodiments, only the extraction plate 112 is electrically conductive and in communication with a bias power supply. The remaining chamber walls 111 may be made of a dielectric material.

Disposed outside and proximate the extraction aperture 115 are extraction optics 170. In certain embodiments, the extraction optics 170 comprises one or more electrodes 180. Each electrode 180 may be a single electrically conductive component with an aperture 185 disposed therein. Alternatively, each electrode 180 may be comprised of two electrically conductive components that are spaced apart so as to create the aperture 185 between the two components. The electrodes 180 may be a metal, such as titanium. One or more of the electrodes 180 may be electrically connected to ground. In certain embodiments, one or more of the electrodes 180 may be biased using an electrode power supply 188. The electrode power supply 188 may be used to bias one or more of the electrodes 180 relative to the ion source chamber 110 so as to attract ions through the extraction aperture 115. The extraction aperture 115 and the aperture 185 are aligned.

While FIG. 1 shows two electrodes 180, in other embodiments, the extraction optics 170 may be more complex. For example, the extraction optics 170 may include one or more additional electrodes. The configuration of the extraction optics 170 may vary and is not limited by this disclosure.

Located downstream from the extraction optics 170 may be a mass analyzer 200. The mass analyzer uses magnetic fields to guide the path of the extracted ions. The mass analyzer 200 comprises a resolving aperture at its distal end. Only those ions that have a selected mass and charge will be directed through the resolving aperture.

The ion implantation system may also comprise a first acceleration/deceleration stage 210. The first acceleration/deceleration stage 210 is used to manipulate the energy of the ion beam by either decelerating the ion beam, or accelerating the ion beam. This may be achieved by applying a bias voltage to the electrodes that comprise the first acceleration/deceleration stage 210. A stage power supply 215 may be used to supply the bias voltage to the first acceleration/deceleration stage 210.

Downstream of the first acceleration/deceleration stage 210 may be a second acceleration/deceleration stage, which may be referred to as an energy purity module 220. The energy purity module 220 is a beam-line lens component configured to independently control deflection, deceleration, and focus of the ion beam. For example, the energy purity module 220 may be a vertical electrostatic energy filter (VEEF) or electrostatic filter (EF). The energy purity module 220 may include an electrode configuration comprising a set of first electrodes 221 disposed on one side of the ion beam and a set of second electrodes 222 disposed on the opposite side of the ion beam. The set of first electrodes 221 and the set of second electrodes 222 may be stationary and have fixed positions. A difference in electrical potentials between the set of first electrodes 221 and the set of second electrodes 222 may be varied along the central ion beam trajectory to reflect an energy of the ion beam at various point along the central ion beam trajectory for independently controlling deflection, deceleration, and/or focus of an ion beam.

In certain embodiments, each of the electrodes in the set of first electrodes 221 may be in communication with a respective power supply. Similarly, each of the electrodes in the set of second electrodes 222 may be in communication with a respective power supply. For purposes of clarity, only one first electrode power supply 223 and one second electrode power supply 224 are shown.

In operation, feed gas from a gas storage container is introduced to the ion source chamber 110 through a gas inlet. The feed gas is energized, causing the creation of a plasma. Ions in that plasma are typically positively charged. Because the electrodes 180 are biased relative to the chamber walls 111 and the extraction plate 112, the ions exit the extraction aperture 115 in the form of an ion beam 1. The ion beam 1 passes through the extraction aperture 115, the aperture 185, the mass analyzer 200, the first acceleration/deceleration stage 210 and the energy purity module 220 and travels toward the workpiece 10.

A controller 250 is also used to control the system. The controller 250 has a processing unit and an associated memory device. This memory device contains the instructions, which, when executed by the processing unit, enable the system to perform the functions described herein. This memory device may be any non-transitory storage medium, including a non-volatile memory, such as a FLASH ROM, an electrically erasable ROM or other suitable devices. In other embodiments, the memory device may be a volatile memory, such as a RAM or DRAM. In certain embodiments, the controller 250 may be a general purpose computer, an embedded processor, or a specially designed microcontroller. The actual implementation of the controller 250 is not limited by this disclosure.

The controller 250 may be in communication with each of the power supplies and may also be in communication with each of the biased components, so that the controller 250 can control and monitor the actual voltage being applied to each of the biased components. For example, the controller 250 may monitor the actual voltage being applied to the electrodes in the extraction optics 170, the first acceleration/deceleration stage 210 or the energy purity module 220. If the voltage is not within a range that is acceptable, the controller 250 may determine that a fault has occurred.

In many ion implantation systems, glitches may occur. A glitch may occur when a high voltage component, such as a biased electrode, discharges to a grounded component, such as a ground electrode, a mechanical support or other component. For example, the extraction optics 170 may include a first electrode that is grounded, and a second electrode that is biased at a high voltage. If particles form on these electrodes, arcing may occur between these electrodes.

Therefore, in certain embodiments, the controller 250 may also produce a trace that shows the voltage of a particular biased component as a function of time. This trace may be a table that includes time and voltage. For example, at fixed intervals, the controller 250 may sample the voltage at each electrode and record that voltage in the table. This information can then be accessed at a later time to determine the voltages and power supply operation. However, the controller 250 may sample these voltages at a certain sampling period. Therefore, any glitches which are shorter in duration than the sampling period may not be observed by the controller 250.

To insure that all or most glitches are observed by the controller 250, a glitch capture module 300 is disposed between the controller 250 and the biased components. In FIG. 1, the glitch capture module 300 is shown in communication with the biased electrode in the extraction optics 170, the first acceleration/deceleration stage 210 and with the first electrodes 221 in the energy purity module 220. However, it is understood that the glitch capture module 300 may be disposed between any biased component and the controller 250.

The glitch capture module 300 is used to monitor the voltages from one or more biased components. In normal operation, the voltage from the biased components is passed through the glitch capture module 300 and supplied directly to the controller 250. However, whenever a glitch is detected, the glitch capture module 300 creates an extended version of the glitch, which is then passed to the controller 250. This extended version is manipulated so as to be longer in duration than the sampling period of the controller 250. In this way, it is guaranteed that the controller 250 observes the glitch. In certain embodiments, the glitch capture module 300 also captures the glitch at its maximum energy. In the case of voltage, the maximum energy occurs when the voltage is closest to ground. In other words, for a positive voltage, the maximum glitch energy occurs at its lowest voltage.

Figure 2:
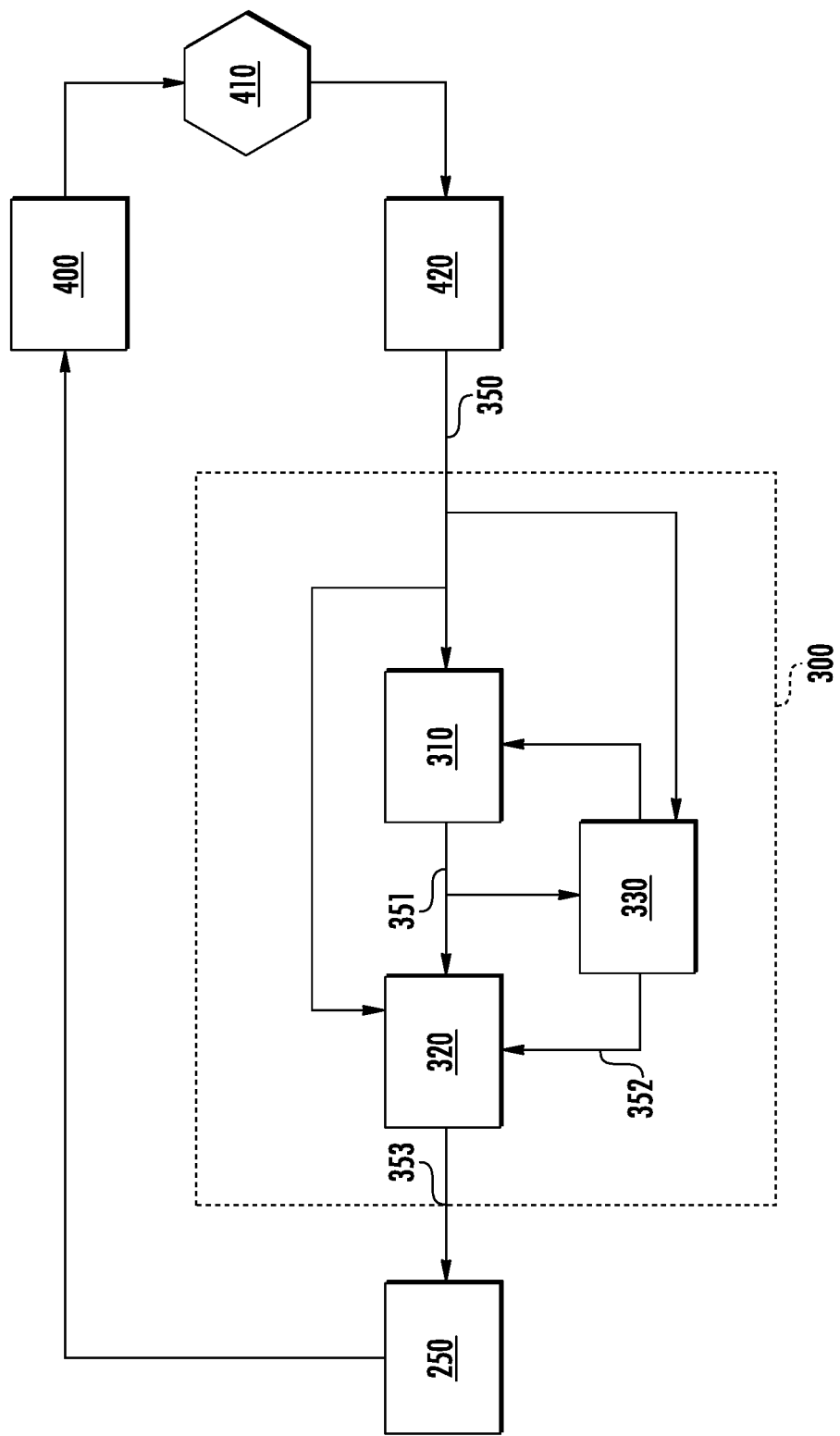
FIG. 2 shows a representative block diagram of the closed loop system for monitoring glitches according to one embodiment.

FIG. 2 shows the glitch capture module 300 according to one embodiment. As described above, the glitch capture module 300 is part of a closed loop system that includes the controller 250, a high voltage power supply 400, a biased component 410, and a high voltage readback path 420.

The glitch capture module 300 receives an analog feedback voltage from the high voltage readback path 420. In certain embodiments, the high voltage readback path 420 comprises a circuit that converts the actual voltage present on the biased component 410 to a smaller positive voltage. For example, the voltage applied to an electrode may be more than −1000 V. The high voltage readback path 420 may convert this to a positive voltage between 0 and 10V, for example. Similarly, a large positive voltage on an electrode may be converted to a smaller positive voltage. In certain embodiments, this conversion is performed using an operational amplifier with a gain of less than 1.

That feedback analog voltage is used as an input to a sample/hold circuit 310. The sample/hold circuit 310 tracks the analog feedback voltage as it is received and holds the minimum voltage that is observed. The output from the sample/hold circuit 310 is transmitted to one input to a selector 320. The analog feedback voltage from the high voltage readback path 420 is used as a second input to the selector 320. The output from the selector 320 is transmitted to the controller 250.

The output from the selector 320 is selected by control logic 330. The control logic 330 receives the analog feedback voltage from the high voltage readback path 420 as a first input, and the output from the sample/hold circuit 310 as a second input. The control logic 330 compares these two inputs and selects the output of the selector 320 based on this comparison. The control logic 330 also determines when the sample/hold circuit 310 is to be reset.

The control logic 330 may include a processing unit in communication with a memory device. The memory device may include instructions, which when executed by the processing unit, allow the control logic to perform the functions described herein. The control logic 330 may also include a timer or other timing device, a comparator, and one or more analog-to-digital converters. In other embodiments, the control logic may not include a processing unit, but may include a dedicated or specially designed state machine or other preprogrammed circuitry.

Figure 3:
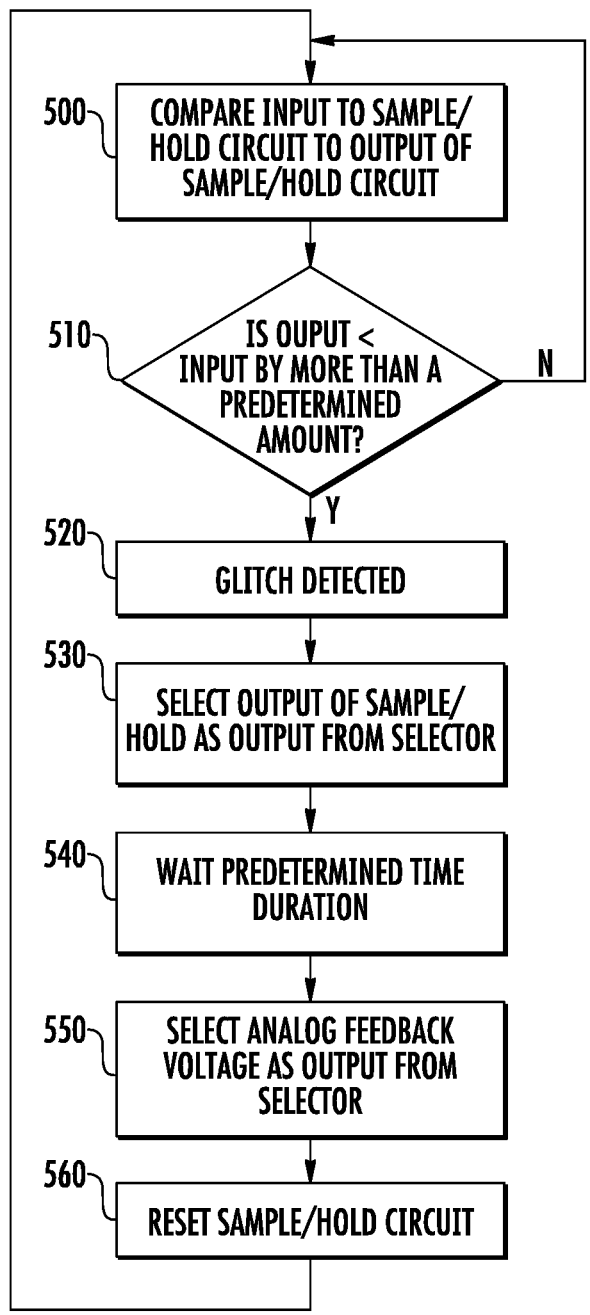
FIG. 3 is a flowchart showing the operation of the glitch capture module of FIG. 2.

FIG. 3 shows a flowchart representative of the operation of the control logic 330 according to one embodiment. First, as shown in Box 500, the control logic 330 compares the input of the sample/hold circuit 310 to the output from the sample/hold circuit 310. Since the sample/hold circuit 310 captures and holds the minimum value of the input, a difference between the input and the output is indicative of a glitch. If the output of the sample/hold circuit 310 is less than the input to the sample/hold circuit 310, this indicates the end of a glitch, since the analog feedback voltage from the high voltage readback path 420 is increasing. If the output from the sample/hold circuit 310 is not less than the input to the sample/hold circuit 310, as shown in Box 510, then the analog feedback voltage is not changing or is decreasing. In this case, the control logic 330 returns to Box 500. If, however, the output from the sample/hold circuit 310 is less than the input to the sample/hold circuit 310 by more than a predetermined amount, as shown in Box 510, then the analog feedback voltage is increasing. This indicates the end of a glitch, as shown in Box 520. Once a glitch has been detected, the control logic 330 changes the output of the selector 320 to reflect the output of the sample/hold circuit 310, as shown in Box 530. In other words, the lowest value of the analog feedback value, which occurred earlier in time, is now presented to the controller 250. The control logic 330 then delays a predetermined duration of time, as shown in Box 540. The predetermined duration of time is selected to be longer than the sampling period of the controller 250, so as to insure that the controller 250 observes the glitch. After the predetermined time duration, the control logic 330 changes the output of the selector 320 to reflect the analog feedback voltage from the high voltage readback path, as shown in Box 550. After this has been completed, the control logic 330 resets the sample/hold circuit 310, as shown in Box 560. The control logic then returns to Box 500.

Figure 4:
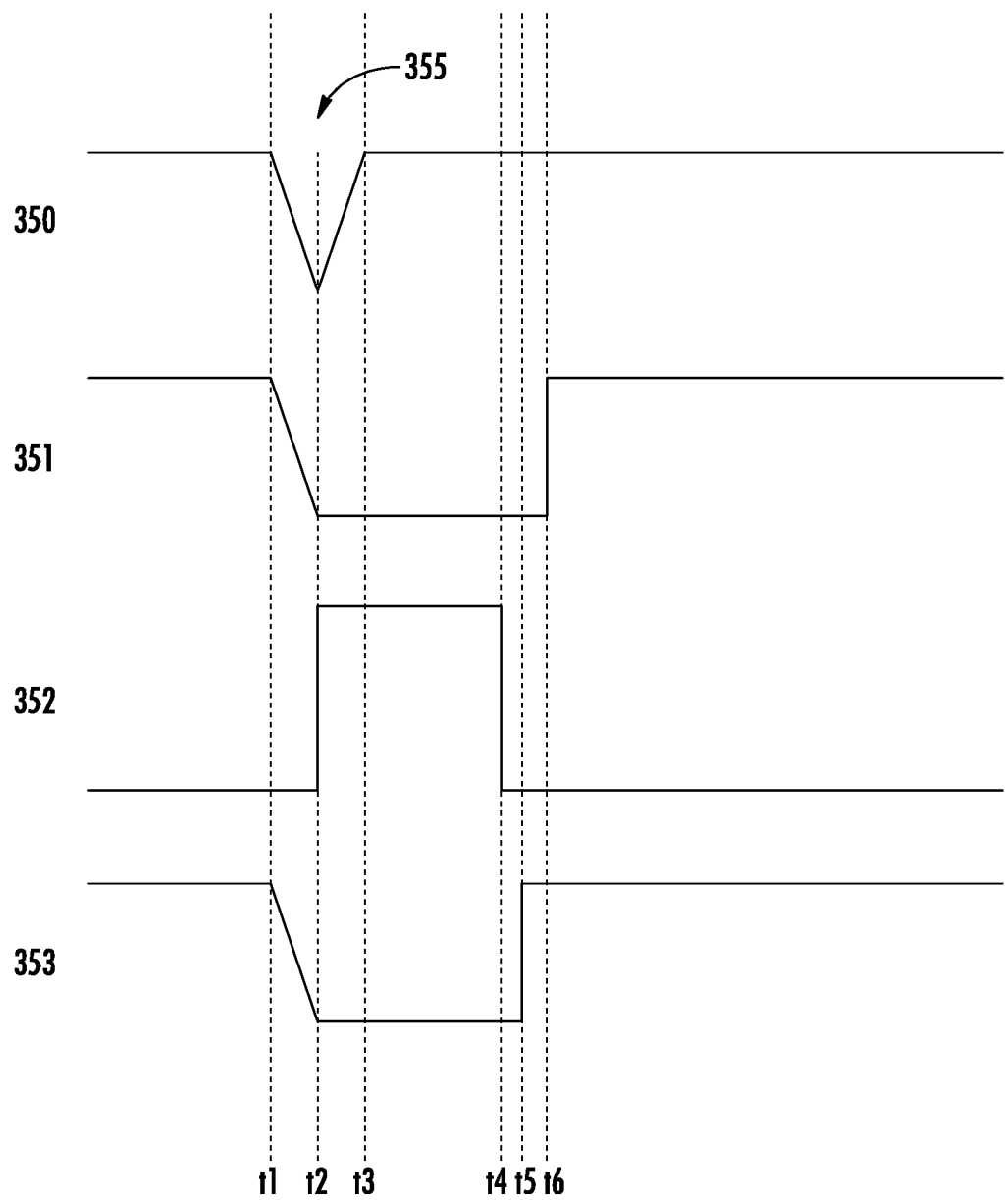
FIG. 4 shows a representative timing diagrams of the signals within the glitch capture module of FIG. 2.

FIG. 4 shows a representative timing diagram illustrating this sequence. The first signal 350 represents the analog feedback voltage from the high voltage readback path 420. The second signal 351 represents the output from the sample/hold circuit 310. The third signal 352 represents the signal to the selector 320 that determines which output is provided. The fourth signal 353 represents the output from the selector 320, which is transmitted to the controller 250.

Initially, the first signal 350 is stable. The output from the sample/hold circuit 310 (second signal 351) is at the same level as first signal 350, since there has not been any negative excursions of the analog feedback voltage. The third signal 352 is set to the value that selects the first signal 350 to pass to the output of the selector 320. The fourth signal 353 shows the voltage present on the first signal 350.

At time t1, a glitch 355 occurs. Between times t1 and t2, the analog feedback voltage is decreasing, so second signal 351 simply tracks the first signal 350. Since the selector 320 is set to pass the first signal 350, fourth signal 353 reflects the first signal 350.

At time t2, the analog feedback voltage begins to return to its normal value. By time t3, the glitch 355 has passed. The output from the sample/hold circuit 310 remains at the lowest voltage. Since the second signal 351 is now less than the first signal 350, the control logic 330 changes the third signal 352 so that the selector 320 reflects the output of the sample/hold circuit 310. Thus, fourth signal 353 retains the lowest voltage that occurred during the glitch 355.

The control logic 330 waits a predetermined duration of time before transitioning the third signal 352 at time t4. Once the third signal 352 is transitioned, the fourth signal 353 again reflects the first signal 350, as shown at time t5. Lastly, the control logic 330 resets the sample/hold circuit 310, at time t6.

Thus, the control logic 330 performs the sequence shown in FIG. 3 to produce outputs similar to those shown in FIG. 4.

While FIG. 2 shows the glitch capture module 300 as a discrete component or set of components, it is understood that the glitch capture module may be incorporated into another device. For example, the glitch capture module 300 may be incorporated in the controller 250 or in the high voltage power supply 400.

Figure 5:
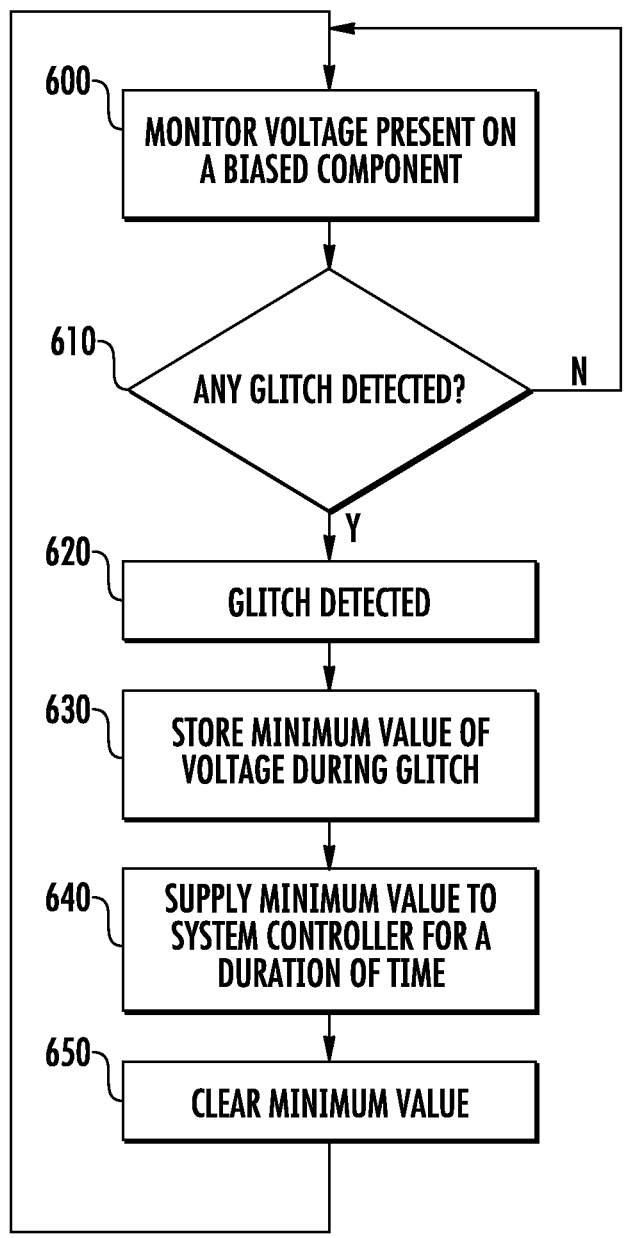
FIG. 5 is a flowchart showing a method of detecting glitches and glitch energy.

In addition to describing a system, the present disclosure also includes a method for monitoring glitch frequency and energy. This method is shown in FIG. 5. First, the voltage present on a biased component is monitored, as shown in Box 600. This monitored voltage is checked to detect any changes in voltage that are associated with a glitch, as shown in Box 610. If the voltage is abnormal, a glitch is detected, as shown in Box 620. The minimum voltage that occurs during the glitch is captured and stored, as shown in Box 630. This minimum value is then supplied to a system controller and held for a duration sufficiently long to insure that the system controller observes this minimum voltage, as shown in Box 640. After this, the minimum voltage is cleared, as shown in Box 650, and the method is repeated.

The system and method described herein have many advantages. By extending the duration of a glitch, the glitch capture module 300 insures that the glitch will be observed by the controller 250. The controller 250 may use this information for many reasons. First, the controller 250 may monitor the frequency at which glitches occur. The frequency may provide an indication of when a preventative maintenance is due. Second, the glitch capture module 300 may capture the minimum voltage that occurred during the glitch, which is indicative of the energy of that glitch. The energy of the glitches may provide an indication of when a preventative maintenance is due. Third, by insuring that the controller 250 observes each glitch, it becomes possible to correlate workpiece performance or failures with glitch activity. For example, assume that a particular workpiece that was processed by the system is defective in some way. By knowing the exact time that this particular workpiece was processing, this can be correlated with the glitch activity. In this way, glitch activity may either be confirmed or disregarded as the cause of the defect.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for processing a workpiece, comprising:
    an ion source;
    an electrically biased component, wherein the component is used to attract, accelerate, decelerate or focus ions along a path of an ion beam;
    a controller; and
    a glitch capture module, wherein the glitch capture module is in communication with the electrically biased component and the controller, and wherein the glitch capture module monitors a voltage present on the electrically biased component, captures and holds a lowest voltage detected on the electrically biased component, and transmits the lowest voltage to the controller, wherein the lowest voltage is captured and held for a predetermined period of time so as to be longer in duration than a sampling period of the controller.

2. The apparatus of claim 1, wherein the controller samples the lowest voltage at a sampling rate, and the glitch capture module maintains the lowest voltage for a duration sufficiently long to insure that the lowest voltage is sampled by the controller.

3. The apparatus of claim 1, wherein the electrically biased component comprises a component in an extraction optics.

4. The apparatus of claim 1, where the apparatus further comprising beamline components.

5. The apparatus of claim 4, wherein the electrically biased component comprises a component in an extraction optics.

6. The apparatus of claim 4, wherein the electrically biased component comprises a component in an acceleration/deceleration stage.

7. The apparatus of claim 4, wherein the electrically biased component comprises a component in an energy purity module.

8. The apparatus of claim 1, wherein the glitch capture module comprises:
   a sample/hold circuit having an input representative of the voltage present on the electrically biased component, and an output, wherein the sample/hold circuit is configured to hold a lowest voltage received on the input until reset;
   control logic in communication with the input and the output of the sample/hold circuit; and
   a selector having an output in communication with the controller, an input in communication with the input of the sample/hold circuit and an input in communication with the output of the sample/hold circuit, wherein the control logic determines a glitch has occurred based on voltages present on the input and the output of the sample/hold circuit and configures the selector to transmit the lowest voltage to the controller.

9. An apparatus for monitoring glitches, comprising:
   an ion implantation system comprising an electrically biased component, wherein the component is used to attract, accelerate, decelerate or focus ions along a path of an ion beam;
   a controller;
   a sample/hold circuit having an input representative of a voltage present on the electrically biased component and an output;
   control logic in communication with the input and the output of the sample/hold circuit;
   and a selector having an output in communication with the controller, an input in communication with the input of the sample/hold circuit and an input in communication with the output of the sample/hold circuit, wherein the sample/hold circuit monitors a voltage present on the electrically biased component and is configured to hold a lowest voltage received until reset, the control logic determines a glitch has occurred based on voltages present on the input and the output of the sample/hold circuit and configures the selector to transmit the lowest voltage to the controller, and the selector transmits a lowest voltage detected to the controller; and
   wherein the lowest voltage is maintained for a predetermined period of time.

10. The apparatus of claim 9, wherein the selector selects between the output of the sample/hold circuit and the input to the sample/hold circuit.

11. The apparatus of claim 10, wherein the control logic compares the output of the sample/hold circuit and the input to the sample/hold circuit, and determines the output of the selector based on a result of the comparison.

12. The apparatus of claim 11, wherein, when the output of the sample/hold circuit is selected, the control logic waits a predetermined time duration before resetting the sample/hold circuit and selecting the input to the sample/hold circuit.

13. The apparatus of claim 9, further comprising a high voltage readback path, comprising a circuit to convert the voltage present on the electrically biased component to a smaller positive voltage, wherein the input to the sample/hold circuit is an output of the high voltage readback path.

14. An apparatus for processing workpieces, comprising:
   an ion source;
   extraction optics;
   an acceleration/deceleration stage;
   a glitch capture module in communication with a component in the extraction optics or the acceleration/deceleration stage, wherein the component is electrically biased using a power supply and is used to attract, accelerate, decelerate or focus ions along a path of an ion beam; and
   a controller;
   wherein the controller receives a signal from the glitch capture module indicative of energy associated with a glitch, and wherein the glitch capture module maintains the signal for a predetermined period of time.

15. The apparatus of claim 14, wherein the glitch capture module comprises:
   a sample/hold circuit having an input representative of a voltage present on the component, and an output;
   control logic in communication with the input and the output of the sample/hold circuit; and
   a selector having an output in communication with the controller, an input in communication with the input of the sample/hold circuit and an input in communication with the output of the sample/hold circuit, wherein the sample/hold circuit monitors a voltage present on the component and is configured to hold a lowest voltage received until reset, the control logic determines a glitch has occurred based on voltages present on the input and the output of the sample/hold circuit and configures the selector to transmit the lowest voltage to the controller, and the selector transmits the signal to the controller.

16. The apparatus of claim 14, wherein the controller determines whether a preventative maintenance process is to be performed based on the signal.

17. The apparatus of claim 14, wherein the controller stores a trace that shows a voltage of the component as a function of time.

18. The apparatus of claim 17, wherein the trace comprises a table that includes time and voltage.

* * * * *